United States Patent
Kim et al.

(10) Patent No.: US 12,191,311 B2
(45) Date of Patent: *Jan. 7, 2025

(54) SEMICONDUCTOR DEVICE INCLUDING FERROELECTRIC MATERIAL, NEUROMORPHIC CIRCUIT INCLUDING THE SEMICONDUCTOR DEVICE, AND NEUROMORPHIC COMPUTING APPARATUS INCLUDING THE NEUROMORPHIC CIRCUIT

(71) Applicant: Samsung Electronics Co., Ltd., Suwon-si (KR)

(72) Inventors: Sangwook Kim, Seongnam-si (KR); Jinseong Heo, Seoul (KR); Yunseong Lee, Osan-si (KR); Sanghyun Jo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/529,505

(22) Filed: Dec. 5, 2023

(65) Prior Publication Data
US 2024/0113127 A1   Apr. 4, 2024

Related U.S. Application Data

(63) Continuation of application No. 16/943,161, filed on Jul. 30, 2020, now Pat. No. 11,887,989.

(30) Foreign Application Priority Data

Jul. 31, 2019   (KR) .................. 10-2019-0093357

(51) Int. Cl.
*H01L 29/786*   (2006.01)
*G06N 3/063*   (2023.01)
(Continued)

(52) U.S. Cl.
CPC ........ *H01L 27/1207* (2013.01); *G06N 3/063* (2013.01); *G06N 3/08* (2013.01)

(58) Field of Classification Search
CPC ............ H01L 27/1207; H01L 21/8258; H01L 21/823857; H01L 27/0922; H01L 27/1225;
(Continued)

(56) References Cited

U.S. PATENT DOCUMENTS

| | | |
|---|---|---|
| 5,940,705 A | 8/1999 | Lee et al. |
| 10,700,093 B1 | 6/2020 | Kalitsov et al. |

(Continued)

FOREIGN PATENT DOCUMENTS

| | | | | |
|---|---|---|---|---|
| CN | 107146759 A | | 9/2017 | |
| CN | 110751279 A | * | 2/2020 | ............. G06F 17/16 |

(Continued)

OTHER PUBLICATIONS

Matthew Jerry et al., 'Ferroelectric FET Analog Synapse for Acceleration of Deep Neural Network Training' *IEEE*, 2017, IEDM17-139-IEDM17-142.
(Continued)

*Primary Examiner* — Samuel Park
(74) *Attorney, Agent, or Firm* — HARNESS, DICKEY & PIERCE, P.L.C.

(57) ABSTRACT

A semiconductor device includes a first transistor including a first channel layer of a first conductivity type, a second transistor provided in parallel with the first transistor and including a second channel layer of a second conductivity type, and a third transistor stacked on the first and second transistors. The third transistor may include a gate insulating film including a ferroelectric material. The third transistor may include third channel layer and a gate electrode that are
(Continued)

spaced apart from each other in a thickness direction with the gate insulating film therebetween.

20 Claims, 8 Drawing Sheets

(51) Int. Cl.
  *G06N 3/08* (2023.01)
  *H01L 27/12* (2006.01)
(58) Field of Classification Search
  CPC .......... H01L 27/0688; H01L 29/78391; H01L 21/823412; H01L 21/823462; H01L 29/40111; H01L 29/516; H01L 29/6684; G06N 3/063; G06N 3/08; G06N 3/065; H10B 51/30
  See application file for complete search history.

(56) References Cited

U.S. PATENT DOCUMENTS

| | | |
|---|---|---|
| 2008/0203443 A1 | 8/2008 | Wilson et al. |
| 2015/0241464 A1 | 8/2015 | Kaneko et al. |
| 2015/0269483 A1* | 9/2015 | Nishitani ............... G06N 3/065 706/25 |
| 2016/0268418 A1 | 9/2016 | Lee et al. |
| 2018/0012123 A1* | 1/2018 | Han ..................... H10B 63/00 |
| 2018/0300626 A1 | 10/2018 | Lee |
| 2019/0019538 A1* | 1/2019 | Li .......................... G06N 3/049 |
| 2019/0074295 A1 | 3/2019 | Schröder |
| 2019/0244653 A1 | 8/2019 | Tsukamoto |
| 2020/0176046 A1* | 6/2020 | Lu ....................... G11C 11/5642 |
| 2020/0266289 A1* | 8/2020 | Yamazaki ......... H01L 21/02337 |
| 2020/0295017 A1* | 9/2020 | Frougier ................ H01L 28/55 |
| 2020/0357453 A1* | 11/2020 | Slesazeck ........... G11C 11/2273 |
| 2021/0034953 A1* | 2/2021 | Pesic .................. H01L 27/0886 |

FOREIGN PATENT DOCUMENTS

| | | | |
|---|---|---|---|
| JP | 4632034 B2 | 2/2011 | |
| JP | 2018067664 A | 4/2018 | |
| KR | 2015/0014577 A | 2/2015 | |
| WO | WO-2020218673 A1 * | 10/2020 | ............. G06N 3/063 |

OTHER PUBLICATIONS

Xiaoyu Sun et al., 'Exploiting Hybrid Precision for Training and Inference: A 2T-1FeFET Based Analog Synaptic Weight Cell' *IEEE*, 2018, IEDM18-55-IEDM18-58.
Notice of Allowance dated Aug. 31, 2023, issued in corresponding U.S. Appl. No. 16/943,161.
Korean Office Action dated Aug. 22, 2024 for corresponding Korean Patent Application No. 10-2019-0093357 and its English-language translation.

* cited by examiner

SEMICONDUCTOR DEVICE INCLUDING FERROELECTRIC MATERIAL, NEUROMORPHIC CIRCUIT INCLUDING THE SEMICONDUCTOR DEVICE, AND NEUROMORPHIC COMPUTING APPARATUS INCLUDING THE NEUROMORPHIC CIRCUIT

CROSS-REFERENCE TO RELATED APPLICATION

This application is a continuation of U.S. application Ser. No. 16/943,161, filed Jul. 30, 2020, which claims the benefit of Korean Patent Application No. 10-2019-0093357, filed on Jul. 31, 2019, in the Korean Intellectual Property Office, the disclosures of each of which are incorporated herein in their entirety by reference.

BACKGROUND

1. Field

The present disclosure relates to semiconductor devices including a ferroelectric material, neuromorphic circuits including the semiconductor devices, and neuromorphic computing apparatuses including the neuromorphic circuits.

2. Description of Related Art

A computing apparatus of an existing Von Neumann Architecture has a structure including a cache memory for storing data, an arithmetic logic unit (ALU) for calculating data, and a controller for controlling these elements in a central processing unit (CPU) chip. Outside the CPU chip, a separate main memory (for example, DRAM) is provided, and data transfer between the main memory and the cache memory is performed through the controller inside the CPU chip.

In this way, a computing apparatus having a structure in which a main memory and an arithmetic logic device are separated generates a bottleneck phenomenon of data in a process of sequentially processing listed information and changing the information to a specific value in order to store the information in a desired and/or alternative predetermined memory device, and thus, the computing apparatus has a limitation in processing speed for calculating a large amounts of data. Also, as a data capacity to be processed increases, power consumption increases due to inefficient data transfer between the main memory and the CPU.

In order to solve this problem, studies about neuromorphic computing that processes information in parallel by simulating the thinking process of a human brain that simultaneously recalls memories and perform computations have been conducted. Accordingly, interests in the development of highly efficient semiconductor devices capable of simulating synapses that act as key elements in a human brain have increased.

SUMMARY

Provided are semiconductor devices including a ferroelectric material.

Provided are neuromorphic circuits by using a semiconductor device including a ferroelectric material.

Provided are neuromorphic computing apparatuses including the neuromorphic circuit by using a semiconductor device including a ferroelectric material.

Additional aspects will be set forth in part in the description which follows and, in part, will be apparent from the description, or may be learned by practice of the presented embodiments of the disclosure.

According to an aspect of an embodiment, a semiconductor device includes: a first transistor including a first channel layer of a first conductivity type, a second transistor provided in parallel with the first transistor and including a second channel layer of a second conductivity type, and a third transistor stacked on the first and second transistors and including a gate insulating film. The third transistor includes a third channel layer and a gate electrode that are spaced apart from each other in a thickness direction with a gate insulating film therebetween. The gate insulating film includes a ferroelectric material.

In some embodiments, the first transistor and the second transistor may be electrically connected to each other.

In some embodiments, the semiconductor device may further include a contact electrode and the contact electrode may electrically connect a drain electrode of the first transistor to a drain electrode of the second transistor.

In some embodiments, a portion of the contact electrode may be in contact with the gate electrode of the third transistor.

In some embodiments, a variation of a resistance of the third channel layer according to a signal applied to the gate electrode of the third transistor may have a symmetry.

In some embodiments, a resistance of the third channel layer according to a signal applied to the gate electrode of the third transistor may be linearly changed.

In some embodiments, the gate electrode of the third transistor may be below the gate insulating film and the third channel layer may be above the gate insulating film.

In some embodiments, the gate electrode of the third transistor may be above the gate insulating film and the third channel layer may be below the gate insulating film.

In some embodiments, the gate insulating film may be a lower gate insulating film below the third channel layer, the third transistor may further include an upper gate insulating film above the third channel layer, and the upper gate insulating film may include a ferroelectric material. The gate electrode may be a lower gate electrode below the lower gate insulating film, and the third transistor may further include an upper gate electrode above the upper gate insulating film.

In some embodiments, the lower gate insulating film may include a first polarization state and the upper gate insulating film may include a second polarization state that may be different from the first polarization state.

In some embodiments, the first channel layer and the second channel layer each may include silicon.

In some embodiments, the third channel layer may include an oxide semiconductor material.

In some embodiments, the ferroelectric material may include at least one of HfO, $Hf_xZr_{1-x}O$, and ZrO. The ferroelectric material may be doped with at least one of Si, Al, Zr, Y, La, Gd, Sr, and Hf.

In some embodiments, the ferroelectric material may include a material having a Perovskite structure.

According to an aspect of an embodiment, a neuromorphic circuit includes pre-synaptic neuron circuits; pre-synaptic lines extending in a first direction from the pre-synaptic neuron circuits; post synaptic neuron circuits; post synaptic lines extending from the post synaptic neuron circuits in a second direction crossing the first direction; and synaptic circuits provided at intersections of the pre-synaptic lines and the post synaptic lines. The synaptic circuits each may include a first transistor including a first channel layer of a first conductivity type, a second transistor including a second channel layer of a second conductivity type, and a third transistor. The first transistor and the second transistor may be parallel with each other on a substrate, and the third transistor may be stacked on the first and second transistors. The third transistor may include a third channel layer and a gate electrode that are spaced apart from each other in a thickness direction with a gate insulating film therebetween. The gate insulating film may include a ferroelectric material.

The synaptic circuit may further include a contact electrode electrically connecting a drain electrode of the first transistor and a drain electrode of the second transistor.

According to an aspect of an embodiment, a neuromorphic computing apparatus includes: an input device; a neuromorphic circuit that is configured to store and output specific information using a signal received from the input device; and a processor that is configured to process information output from the neuromorphic circuit.

According to an aspect of an embodiment, a semiconductor device includes: a CMOS circuit including a first transistor of a first conductivity type and a second transistor of a second conductivity type; a third transistor including a gate electrode and a gate insulating film, the gate insulating film including a ferroelectric material; and a contact electrode connected to the gate electrode of the third transistor, a drain of the first transistor, and a drain of the second transistor.

In some embodiments, the third transistor may be stacked on the CMOS circuit.

In some embodiments, the ferroelectric material includes at least one of HfO, $Hf_xZr_{1-x}O$, and ZrO. The ferroelectric material may be doped with at least one of Si, Al, Zr, Y, La, Gd, Sr, and Hf.

In some embodiments, a neuromorphic circuit may include a synaptic circuit including one of the semiconductor devices above; a pre-synaptic neuron circuit; a pre-synaptic line connecting the synaptic circuit to the pre-synaptic neuron circuit; a post-synaptic neuron circuit; and a post-synaptic line connecting the synaptic circuit to the post-synaptic neuron circuit.

In some embodiments, a neuromorphic computing apparatus may include an input device; one of the neuromorphic circuits above, where the neuromorphic circuit may be configured to store and output specific information using a signal received from the input device; and a processor configured to process information that may be output from the neuromorphic circuit.

BRIEF DESCRIPTION OF THE DRAWINGS

The above and other aspects, features, and advantages of embodiments of inventive concepts will be more apparent from the following description taken in conjunction with the accompanying drawings, in which.

DETAILED DESCRIPTION

Figure 1:
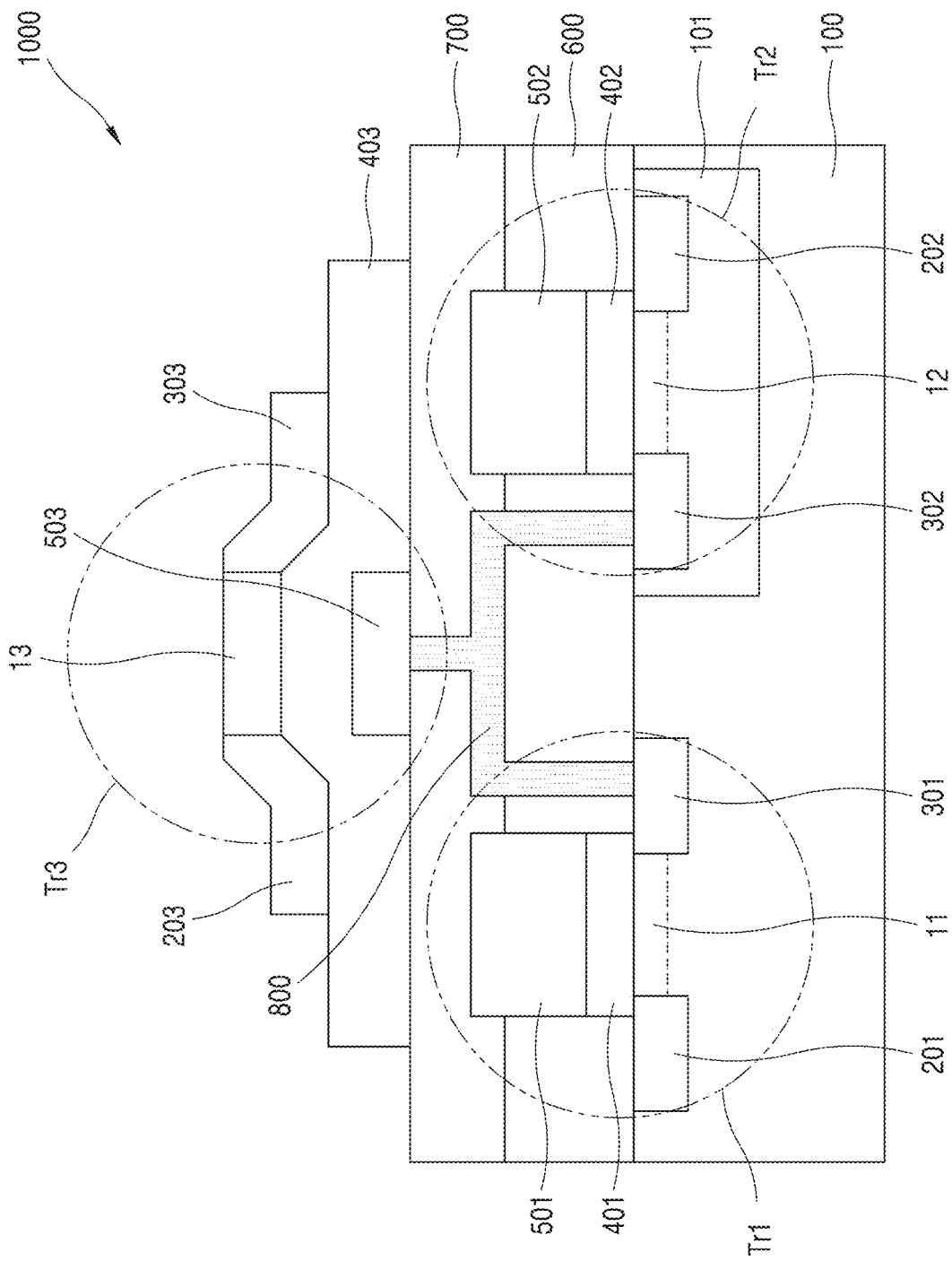
FIG. 1 is a lateral cross-sectional view briefly showing a semiconductor device according to an embodiment.

Reference will now be made in detail to embodiments, examples of which are illustrated in the accompanying drawings, wherein like reference numerals refer to like elements throughout. In this regard, inventive concepts may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of" (e.g., at least one of A, B, and C), when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, a semiconductor device including a ferroelectric material, a neuromorphic circuit including the same, and a neuromorphic computing apparatus will be described in detail with reference to the accompanying drawings. In the drawings, like reference numerals refer to like elements, and the size or thickness of each element may be exaggerated for clarity.

It will be understood that although the terms "first", "second", etc. may be used herein to describe various components, these components should not be limited by these terms. The terms are only used to distinguish one component from another. A semiconductor device including a ferroelectric material, a neuromorphic circuit including the same, and a neuromorphic computing apparatus may be realized in various different forms and are not limited to the embodiments described herein.

Also, the term " . . . units" or "modules" in the specification may denote units or modules that process at least one function or operation, and may be realized by hardware, software, or a combination of hardware and software.

Hereinafter, when it is described using an expression "above" or "on", the element may include not only the element being "immediately on/under/left/right in a contact manner" but also being "on/under/left/right in a non-contact manner". Reference will now be made in detail to embodiments, examples of which are illustrated in the accompanying drawings.

It should be understood that, when a part "comprises" or "includes" an element in the specification, unless otherwise defined, it is not excluding other elements but may further include other elements.

In the field of image or speech recognition technology, a technology utilizing a deep neural network (DNN) has made tremendous improvement. However, the energy efficiency and speed of DNN learning by using the Von Neumann computing architecture is limited. In order to solve this problem, an in-memory computing technology that may store and process data in one location has been proposed. In relation to a neural network, there is a concept of weight, which is a value multiplied by input data. Generally, the weight is stored as an analog conductance value in a nonvolatile memory. Attempts have been made to implement hardware in accordance with the in-memory computing technology by using resistive random-access memory (RRAM), phase change memory (PCM), etc. that are nonvolatile memories. However, there is a tendency that the accuracy of an in-memory computing apparatus implemented by using RRAM or PCM is deteriorated due to asymmetric and nonlinear change of the weight. There is a MNIST (Modified National Institute of Standards and Technology) data set which is a huge database used for machine learning. MNIST data set includes about 60,000 training images and 10,000 test images. For example, in the case of image recognition by using a neural network using RRAM, a MNIST data set is identified with a 41% probability, and in the case of image recognition by using a neural network using PCM, the MNIST data set is identified with a 73% probability. Unlike this, when a neural network is realized by using a semiconductor device, a neuromorphic circuit, and a neuromorphic computing apparatus according to various embodiments described with reference to FIGS. 1 through 8, a MNIST data set may be identified with a high probability of about 97.3%.

Figure 2:
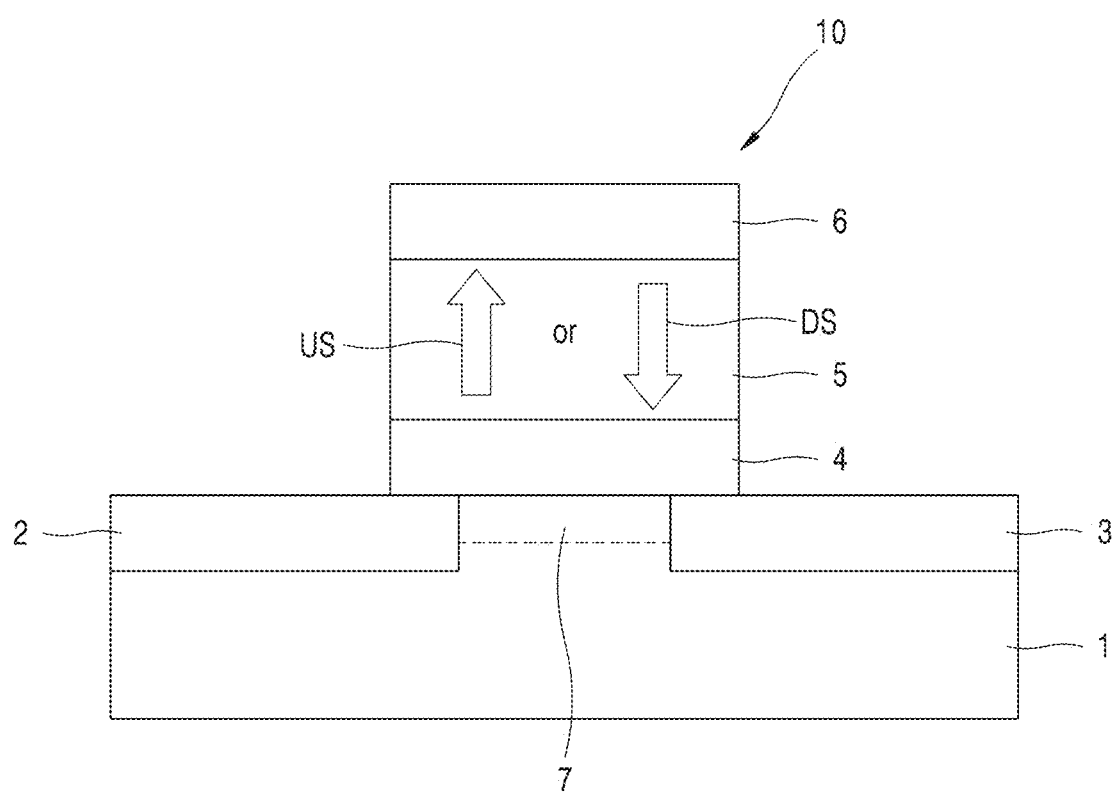
FIG. 2 a diagram briefly showing a polarization state of a semiconductor device including an exemplary ferroelectric material.
Figure 3:
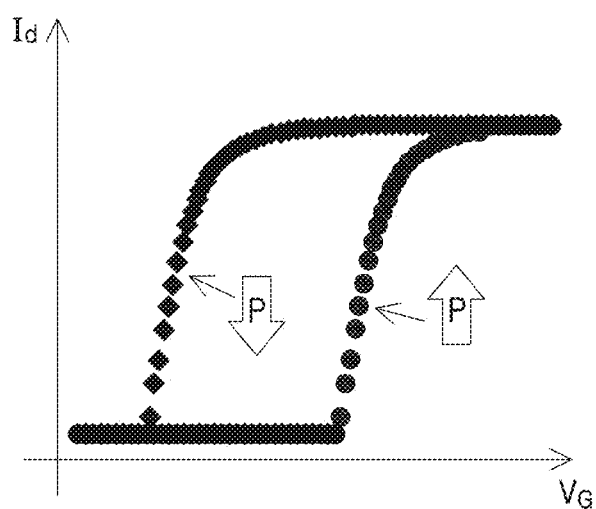
FIG. 3 is a graph briefly showing a change in a threshold voltage according to the polarization state of the semiconductor device of FIG. 2.
Figure 4:
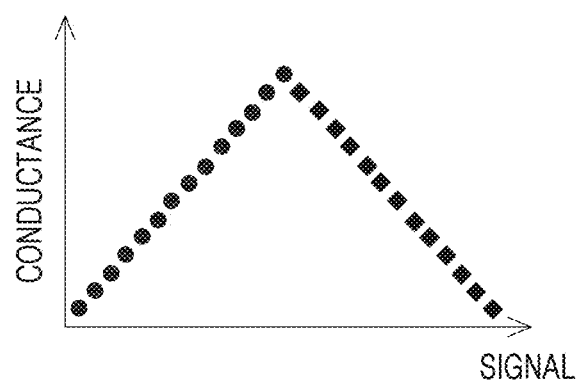
FIG. 4 is a graph briefly showing a resistance change state of a third channel layer of FIG. 1.

FIG. 1 is a lateral cross-sectional view briefly showing a semiconductor device 1000 according to an embodiment. FIG. 2 a diagram briefly showing a polarization state of a semiconductor device 10 including a ferroelectric material as an example. FIG. 3 is a graph briefly showing a change in a threshold voltage according to the polarization state of the semiconductor device 10 of FIG. 2. FIG. 4 is a graph briefly showing a resistance change state of a third channel layer 13 of FIG. 1.

Referring to FIG. 1, the semiconductor device 1000 may include a first transistor Tr1 having a first channel layer 11 of a first conductivity type, a second transistor Tr2 provided in parallel with the first transistor Tr1 and having a second channel layer 12 of a second conductivity type, and a third transistor Tr3 stacked on the first transistor Tr1 and the second transistor Tr2 and including a gate insulating film 403 including a ferroelectric material and a third channel layer 13 and a gate electrode 503 that are apart from each other in a thickness direction with the gate insulating film 403 therebetween. Also, the semiconductor device 1000 may further include a first insulating layer 600 and a second insulating layer 700 covering the first and second transistors Tr1 and Tr2. The third transistor Tr3 may be spaced apart from the first and second transistors Tr1 and Tr2 with the first insulating layer 600 and the second insulating layer 700 therebetween. The first conductivity type and the second conductivity type may denote, for example, a p-type and an n-type, respectively.

The first transistor Tr1 and the second transistor Tr2 may be provided on a substrate 100. For example, the substrate 100 may include a semiconductor substrate such as a silicon substrate. Furthermore, the substrate 100 may have a p-type conductivity by doping the substrate 100 with a p-type dopant (for example, boron B). Accordingly, the density of holes in the substrate 100 may be higher than the density of electrons.

The first transistor Tr1 may include an n-type transistor. For example, the first transistor Tr1 may include a first source electrode 201 and a first drain electrode 301 having an n-type conductivity formed by doping a portion of the substrate 100 with an n-type dopant (for example, phosphorus P). The first channel layer 11 may be provided between the first source electrode 201 and the first drain electrode 301. The first channel layer 11 may include the same material as the substrate 100. For example, the first channel layer 11 may include silicon.

Also, the first transistor Tr1 may include a first gate insulating layer 401 and a first gate electrode 501. The first gate insulating layer 401 and the first gate electrode 501 may be sequentially stacked on the first channel layer 11. The first gate insulating layer 401 may include an insulating material, such as silicon oxide ($SiO_2$), but is not limited thereto. The first gate electrode 501 may include polysilicon, a metal, an alloy, or a metal compound. For example, the first gate electrode 501 may include a material, such as TiN or TaN, but is not limited thereto.

The second transistor Tr2 may include a p-type transistor. For example, the second transistor Tr2 may include a second source electrode 202 and a second drain electrode 302 having an n-type conductivity formed by doping a portion of the substrate 100 with a p-type dopant (for example, phosphorus P). The second channel layer 12 may be provided between the second source electrode 202 and the second drain electrode 302. The second channel layer 12 may include the same material as the substrate 100. For example, the second channel layer 12 may include silicon. Also, the second source electrode 202 and the second drain electrode 302 may be surrounded by an n-type well 101 provided in a periphery thereof.

Also, the second transistor Tr2 may include a second gate insulating layer 402 and a second gate electrode 502. The second gate insulating layer 402 and the second gate electrode 502 may be sequentially stacked on the second channel layer 12. The second gate insulating layer 402 may include an insulating material, such as silicon oxide ($SiO_2$), but is not limited thereto. The second gate electrode 502 may include polysilicon, a metal, an alloy, or a metal compound. For example, the second gate electrode 502 may include a material, such as TiN or TaN, but is not limited thereto.

The first transistor Tr1 and the second transistor Tr2 may be electrically connected to each other. For example, the first transistor Tr1 may be electrically connected to the second transistor Tr2 by a contact electrode 800 that connects the first drain electrode 301 to the second drain electrode 302. The contact electrode 800 may have a bridge shape. Also, the contact electrode 800 may have a Y-shape by including a protrusion in the middle of the bridge shape.

In this way, since the p-type first transistor Tr1 and the n-type second transistor Tr2 are arranged in parallel with each other, a complementary metal oxide semiconductor (CMOS) device may be formed. Although a simplified CMOS is depicted in FIG. 1, constituent elements for driving the CMOS may be further provided. The CMOS may be referred to as a logic device.

Turning each of the first channel layer 11 and the second channel layer 12 on/off may be controlled by a signal applied to each of the first gate electrode 501 and the second gate electrode 502. For example, when a first voltage is equally applied to the first gate electrode 501 and the second gate electrode 502, the first channel layer 11 may be in an on-state and the second channel layer 12 may be in an off-state. For example, the first voltage may be a desired and/or alternative predetermined positive voltage. In this case, when a desired and/or alternative predetermined voltage is applied between the first source electrode 201 and the first drain electrode 301, electrons may move from the first source electrode 201 to the first drain electrode 301. Also, when a second voltage is equally applied to the first gate electrode 501 and the second gate electrode 502, the first channel layer 11 may be in an off-state and the second channel layer 12 may be in an on-state. For example, the second voltage may be a desired and/or alternative predetermined negative voltage. In this case, when a desired and/or alternative predetermined voltage is applied between the second source electrode 202 and the second drain electrode 302, holes may move from the second source electrode 202 to the second drain electrode 302.

The first insulating layer 600 may be formed to surround side surfaces of the first and second gate electrodes 501 and 502 and the contact electrode 800. For example, the first insulating layer 600 may include a hole surrounding the first and second gate electrodes 501 and 502 and the contact electrode 800. The second insulating layer 700 may cover upper surfaces of the first and second gate electrodes 501 and 502. Furthermore, the second insulating layer 700 may be an insulating layer surrounding the protrusion of the contact electrode 800. For example, the second insulating layer 700 may include a hole that surrounds side surfaces of the protrusion of the contact electrode 800 and exposes the protrusion to the outside. The first and second insulating layers 600 and 700 may include a material of an insulating layer included in a general semiconductor device.

The third transistor Tr3 may be provided on the second insulating layer 700. The third transistor Tr3 may include the third channel layer 13 and the gate electrode 503 spaced apart from each other in a thickness direction with a third gate insulating film 403 therebetween. The gate electrode 503 may be referred to as a third gate electrode 503. Also, the gate insulating film 403 may be referred to as a third gate insulating film 403. The third transistor Tr3 may further include a third source electrode 203 and a third drain electrode 303 provided on both sides of the third channel 13. The third source electrode 203 and the third drain electrode 303 may have an n-type or a p-type conductivity.

The third gate insulating film 403 may include a ferroelectric material. The ferroelectric material may denote a material that may have a dipole without electrical stimulation from the outside. For example, when a desired and/or alternative predetermined electrical stimulation is applied to the third gate insulating film 403 including a ferroelectric material, the third gate insulating film 403 may have a desired and/or alternative predetermined polarization state. Thereafter, even if the electrical stimulation applied to the third gate insulating film 403 disappears, the third gate insulating film 403 is in a remanent polarization state. In this way, a threshold voltage of the third gate electrode 503 in contact with the third gate insulating film 403 may be changed by the third gate insulating film 403 having a desired and/or alternative predetermined polarization state. Information corresponding to the polarization state of the third gate insulating film 403 may be stored in the third transistor Tr3. Accordingly, the third transistor Tr3 may be operated as a nonvolatile memory device.

The ferroelectric material in the third gate insulating film 403 may include at least one of a high dielectric material, such as HfO, $Hf_xZr_{1-x}O$, ZrO, etc. to which at least one of Si, Al, Zr, Y, La, Gd, Sr, and Hf is doped. For example, the ferroelectric material may include a transformed material obtained by heat treating a high dielectric material. Alternatively, the ferroelectric material may include a material of a Perovskite structure. For example, a material of Perovskite structure may include PZT, BTO, and the like.

In addition, the structure of the third transistor Tr3 may be changed according to a relative position with respect to the third gate insulating film 403 of the third gate electrode 503.

For example, the third gate electrode 503 may be provided below the third gate insulating film 403, and the third channel layer 13 may be provided above the third gate insulating film 403. For example, a trench structure may be formed in a region of a lower portion of the third gate insulating film 403, and the third gate electrode 503 may be provided in the trench structure. In this way, the structure in which the third gate electrode 503 is provided below the third gate insulating film 403 is referred to as a bottom gate-type structure. A top gate-type structure and a double gate-type structure will be described below with reference to FIGS. 5 and 6.

The third channel layer 13 may include an oxide semiconductor material. For example, the oxide semiconductor material may include at least one of InGaZnO, InZnO, and InSnZnO. Since the third channel layer 13 includes an oxide semiconductor material, an activation process of the third channel layer 13 may be performed at 500° C. or less. Accordingly, the third transistor Tr3 may be easily stacked on the first and second transistors Tr1 and Tr2.

The third gate electrode 503 may be electrically connected to a portion of the contact electrode 800. For example, the third gate electrode 503 may contact the protrusion of the contact electrode 800. In this way, the third gate electrode 503 of the third transistor Tr3 may be electrically connected to the first and second transistors Tr1 and Tr2. Accordingly, an electrical signal applied to the third gate electrode 503 may be controlled by controlling the operation of the first and second transistors Tr1 and Tr2, that is, the CMOS. In this way, the polarization state of the third gate insulating film 403 adjacent to the third gate electrode 503 may be controlled by controlling an electrical signal applied to the third gate electrode 503.

Referring to FIG. 2, the semiconductor device 10 may include a substrate 1, a source electrode 2 and a drain electrode 3 formed on both sides of the substrate 1, an insulating layer 4 formed on the substrate 1, a gate insulating film 5 formed on the insulating layer 4, and a gate electrode 6 formed on the gate insulating film 5. Also, a channel layer 7 may be formed between the source electrode 2 and the drain electrode 3. For example, the semiconductor device 10 may be a kind of metal oxide semiconductor field effect transistor (MOSFET).

The gate insulating film 5 may include a ferroelectric material. The gate insulating film 5 may include a first polarization state US. For example, the first polarization state US may be an up polarization state. The first polarization state US may be generated by applying a negative voltage to the gate electrode 6.

Also, the gate insulating film 5 may include a second polarization state DS. For example, the second polarization state US may be a down polarization state. The second polarization state US may be generated by applying a positive voltage to the gate electrode 6.

The principle of changing the polarization state of the semiconductor device 10 may be applied to the third transistor Tr3 of FIG. 1.

Referring to FIG. 3, a threshold voltage of the semiconductor device 10 of FIG. 2 may vary according to the polarization state of the gate insulating film 5.

When the gate insulating film 5 is in a down polarization state, the threshold voltage of the semiconductor device 10 may be relatively low. The reason why the threshold voltage of the semiconductor device 10 is reduced may be a result from a high carrier concentration in the channel layer 7 due to the down polarization of the gate insulating film 5.

On the contrary, when the gate insulating film 5 is in an up polarization state, the threshold voltage of the semiconductor device 10 may be relatively high. The reason why the threshold voltage of the semiconductor device 10 is increased may be a result from a low carrier concentration in the channel layer 7 due to the up polarization of the gate insulating film 5.

In this way, the principle of changing the threshold voltage of the semiconductor device 10 according to the polarization state of the gate insulating film 5 may also be applied to the third transistor Tr3 of FIG. 1.

Hereinafter, an aspect of changing of the resistance of the third channel layer 13 of FIG. 1 will be described with reference to FIG. 4. In FIG. 4, the horizontal axis of the graph denotes an electrical signal value applied to the third gate electrode 503 of FIG. 1, and the vertical axis of the graph denotes the conductance of the third channel layer 13.

Referring to FIG. 4, while an electrical signal (for example, a voltage signal) is applied to the third gate electrode 503, the conductance of the third channel layer 13 may linearly increase and then may linearly decrease from a certain point. In other words, the resistance of the third channel layer 13 may linearly vary according to a signal applied to the third gate electrode 503.

Furthermore, while an electrical signal is applied to the third gate electrode 503, a section in which the conductance of the third channel layer 13 increases and a section in which the conductance decreases may be symmetrical. In other words, the resistance change pattern of the third channel layer 13 according to the signal applied to the third gate electrode 503 may have symmetry.

Figure 5:
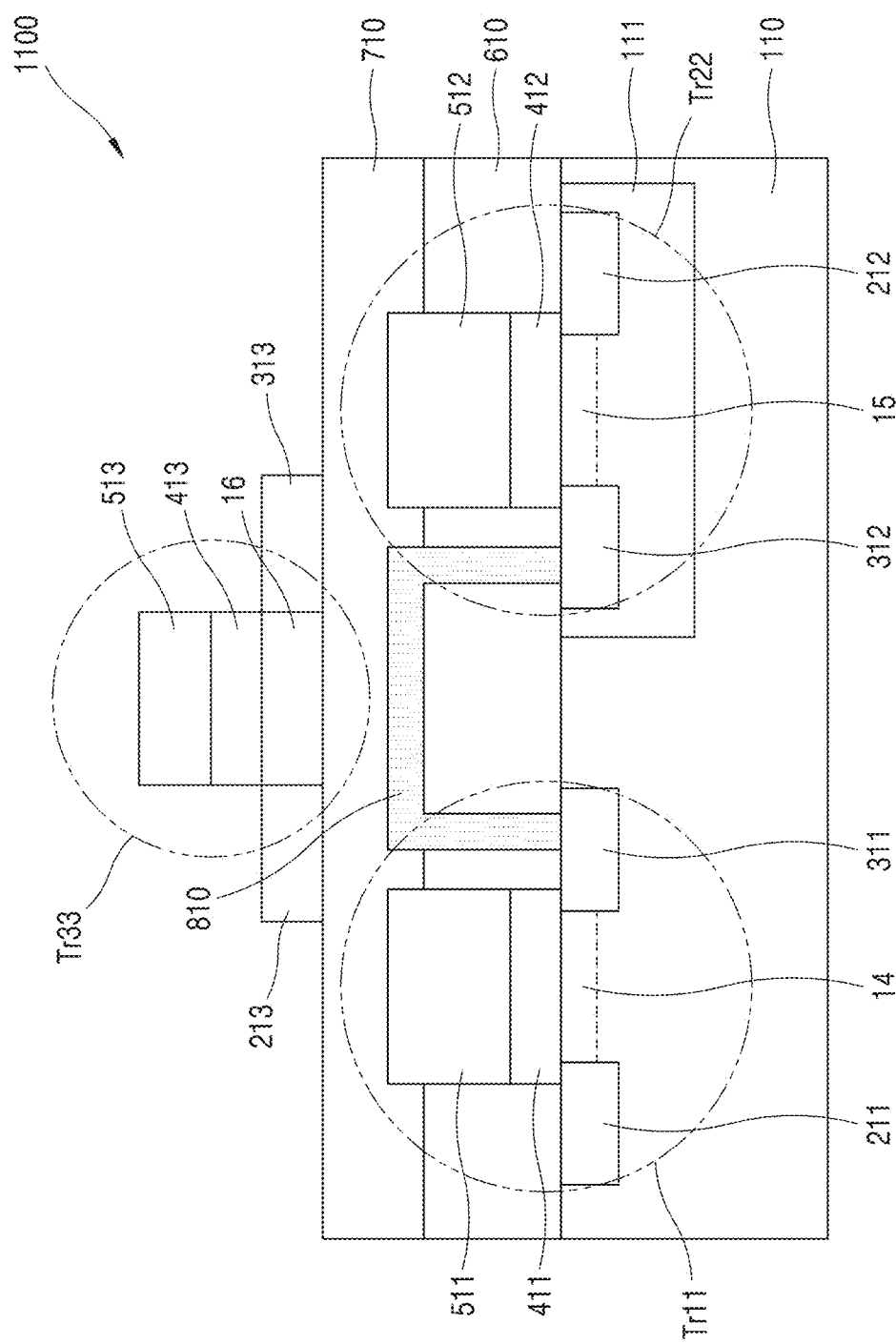
FIG. 5 is a schematic lateral cross-sectional view briefly showing a semiconductor device according to another embodiment.

FIG. 5 is a lateral cross-sectional view briefly showing a semiconductor device 1100 according to another embodiment. In the description of FIG. 5, descriptions previously given with reference to FIG. 1 will be omitted.

Referring to FIG. 5, the semiconductor device 1100 may include a first transistor Tr11 having a first channel layer 14 of a first conductivity type, a second transistor Tr22 provided in parallel with the first transistor Tr11 and having a second channel layer 15 of a second conductivity type, and a third transistor Tr33 stacked on the first transistor Tr11 and the second transistor Tr22 and including a third gate insulating film 413 including a ferroelectric material and a third channel layer 16 and a third gate electrode 513 that are spaced apart from each other in a thickness direction with the third gate insulating film 413 therebetween. Also, the semiconductor device 1100 may further include a first insulating layer 610 and a second insulating layer 710 covering the first and second transistors Tr11 and Tr22. The first and second insulating layers 610 and 710 may be the same as the first and second insulating layers 600 and 700 of FIG. 1. The third transistor Tr33 may be spaced apart from the first and second transistors Tr11 and Tr22 with the first and second insulating layers 610 and 710 therebetween. The first conductivity type and the second conductivity type may denote, for example, a p-type and an n-type, respectively.

The first transistor Tr11 and the second transistor Tr22 may be provided on a substrate 110. The substrate 110 may be the same as the substrate 100 of FIG. 1.

The first transistor Tr11 may be the same as the first transistor Tr1 of FIG. 1, and the second transistor Tr22 may be the same as the second transistor Tr2 of FIG. 1. For example, the first transistor Tr11 may include a first source electrode 211, a first drain electrode 311, the first channel layer 14 provided between the first source electrode 211 and the first drain electrode 311, a first gate insulating film 411 and a first gate electrode 511 sequentially stacked on the first channel layer 14. Also, for example, the second transistor Tr22 may include a second source electrode 212, a second drain electrode 312, a second channel layer 15 provided between the second source electrode 212 and the second drain electrode 312, a second gate insulating film 412 and a second gate electrode 512 sequentially stacked on the second channel layer 15. Also, the second transistor Tr22 may further include an n-type well 111 formed to surround a periphery of the second source electrode 212 and the second drain electrode 312.

The first transistor Tr11 and the second transistor Tr22 may be electrically connected to each other. For example, the first transistor Tr11 may be electrically connected to the second transistor Tr22 by a contact electrode 810 that connects the first drain electrode 311 to the second drain electrode 312. The contact electrode 810 may be substantially the same as the contact electrode 800 of FIG. 1. The formation of a CMOS by the first and second transistors Tr11 and Tr22 that are electrically connected to each other may be the same as the formation of the CMOS described above with reference to FIG. 1.

The third transistor Tr33 may include a third channel layer 16 and a third gate electrode 513 spaced apart from each other in a thickness direction with the third gate insulating film 413 therebetween. The third transistor T33 may further include a third source electrode 213 and a third drain electrode 313 provided at both sides of the third channel layer 16. The third source electrode 213 and the third drain electrode 313 may have an n-type or a p-type conductivity.

The third gate insulating film 413 may be the same as the third gate insulating film 403 of FIG. 1. For example, the third gate insulating film 413 may include a ferroelectric material. As described with reference to FIG. 1, a threshold voltage of the third gate electrode 513 in contact with the third gate insulating film 413 may be changed by the third gate insulating film 413 having a desired and/or alternative predetermined polarization state.

Unlike the third transistor Tr3 of FIG. 1, the third transistor Tr33 may have a top gate-type structure. For example, the third gate electrode 513 may be provided above the third gate insulating film 413, and the third channel layer 16 may be provided below the third gate insulating film 413. The third channel layer 16 of the third transistor Tr33 having a top gate-type structure may be provided on the second insulating film 710. A third source electrode 213 and a third drain electrode 313 respectively may be provided on both sides of the third channel layer 16. Compared with the bottom gate-type structure, the top gate-type structure has an advantage in that the ferroelectric characteristics of the third gate insulating film 413 included in the third transistor Tr33 may further be easily expressed. In other words, in a process of heat treating the third gate insulating film 413, when the third gate electrode 513 is arranged above the third gate insulating film 413 instead of below the third gate insulating film 413, the ferroelectric feature of the third gate insulating film 413 may be more prominent.

The material of the third channel layer 16 may be the same as the material of the third channel layer 13 of FIG. 1. For example, the third channel layer 16 may include an oxide semiconductor material.

The third gate electrode 513 may be electrically connected to a portion of the contact electrode 810. In FIG. 5, it is depicted that the third gate electrode 513 and the contact electrode 810 are disconnected from each other by being spaced apart from each other, but the third gate electrode 513 and the contact electrode 810 may be electrically connected to each other through another path (not shown). In this way, the third gate electrode 513 of the third transistor Tr33 may be electrically connected to the first and second transistors Tr11 and Tr22. Accordingly, after controlling an electrical signal applied to the third gate electrode 513 by controlling the operation of the first and second transistors Tr11 and Tr22, that is, the CMOS, the polarization state of the third gate insulating film 413 adjacent to the third gate electrode 513 may be controlled as described with reference to FIG. 1.

Figure 6:
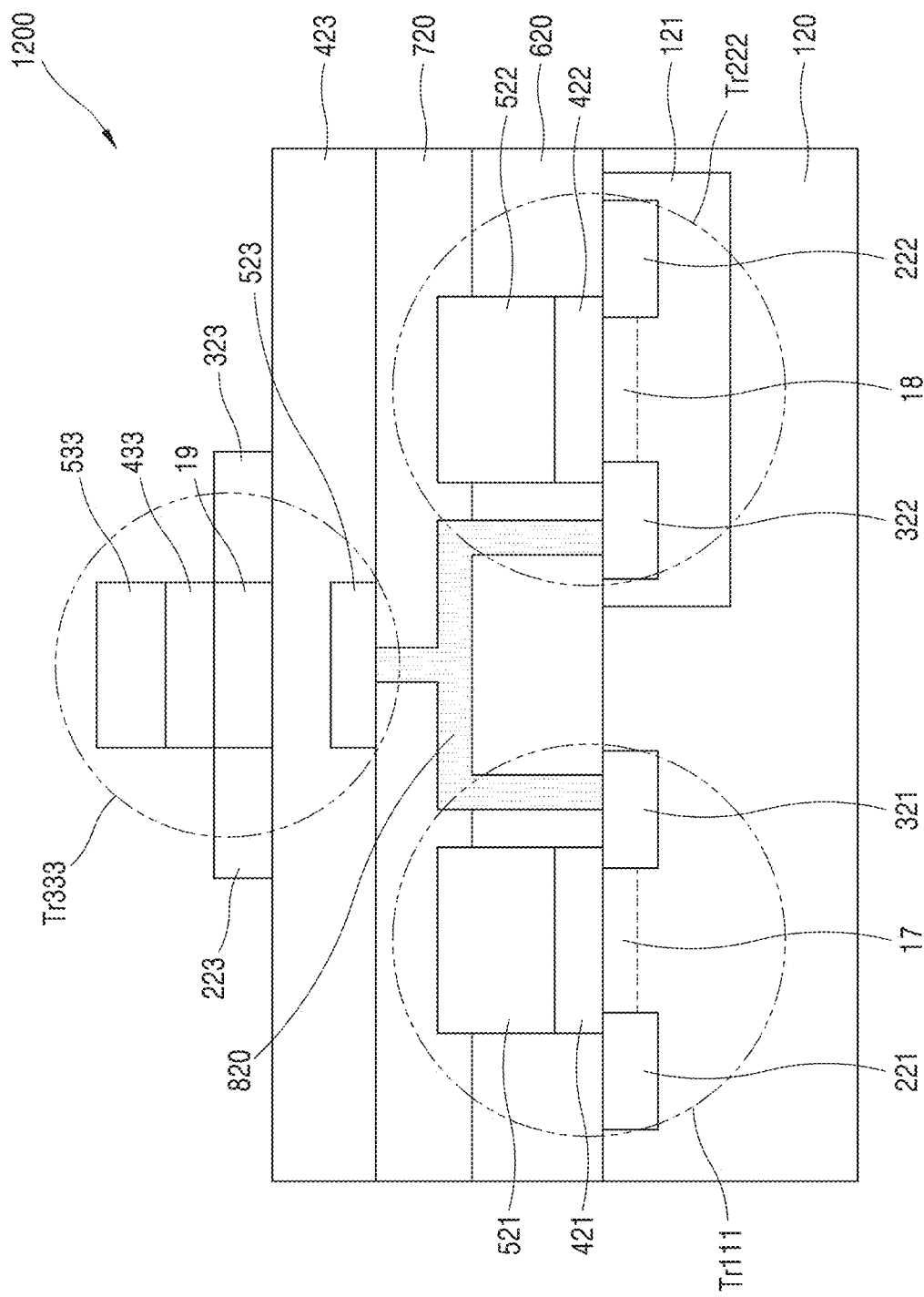
FIG. 6 is a schematic lateral cross-sectional view briefly showing a semiconductor device according to another embodiment.

FIG. 6 is a lateral cross-sectional view briefly showing a semiconductor device 1200 according to another embodiment. In the description of FIG. 6, descriptions previously given with reference to FIG. 1 will be omitted.

Referring to FIG. 6, the semiconductor device 1200 may include a first transistor Tr111 having a first channel layer 17 of a first conductivity type, a second transistor Tr222 provided in parallel with the first transistor Tr111 and having a second channel layer 18 of a second conductivity type, and a third transistor Tr333 stacked on the first transistor Tr111 and the second transistor Tr222 and including gate insulating films 423 and 433 including a ferroelectric material and a third channel layer 19, a lower gate electrode 523 and a upper gate electrode 533 that are spaced apart from each other in a thickness direction with the gate insulating films 423 and 433 therebetween. Also, the semiconductor device 1200 may further include a first insulating layer 620 and a second insulating layer 720 covering the first and second transistors Tr111 and Tr222. The first and second insulating layers 620 and 720 may be the same as the first and second insulating layers 600 and 700 of FIG. 1. The third transistor Tr333 may be spaced apart from the first and second transistors Tr111 and Tr222 with the first and second insulating layers 620 and 720 therebetween. The first conductivity type and the second conductivity type may respectively denote, for example, a p-type and an n-type.

The first transistor Tr111 and the second transistor Tr222 may be provided on a substrate 120. The substrate 120 may be the same as the substrate 100 of FIG. 1.

The first transistor Tr111 may be the same as the first transistor Tr1 of FIG. 1, and the second transistor Tr222 may be the same as the second transistor Tr2 of FIG. 1. For example, the first transistor Tr111 may include a first source electrode 221, a first drain electrode 321, the first channel layer 17 provided between the first source electrode 221 and the first drain electrode 321, and a first gate insulating film 421 and a first gate electrode 521 sequentially stacked on the first channel layer 17. Also, for example, the second transistor Tr222 may include a second source electrode 222, a second drain electrode 322, the second channel layer 18 provided between the second source electrode 222 and the second drain electrode 322, a second gate insulating film 422 and a second gate electrode 522 sequentially stacked on the second channel layer 18. Also, the second transistor Tr222 may further include an n-type well 121 formed to surround a periphery of the second source electrode 222 and the second drain electrode 322.

The first transistor Tr111 and the second transistor Tr222 may be electrically connected to each other. For example, the first transistor Tr111 may be electrically connected to the second transistor Tr222 by a contact electrode 820 connecting the first drain electrode 321 to the second drain electrode 322. The contact electrode 820 may be the same as the contact electrode 800 of FIG. 1. For example, the contact electrode 820 may have a bridge shape (a Y-shape) including a protrusion in the middle thereof. The formation of a CMOS by the first and second transistors Tr111 and Tr222 that are electrically connected to each other may be the same as the formation of the CMOS described above with reference to FIG. 1.

The third transistor Tr333 may further include a third source electrode 223 and a third drain electrode 323 provided at both sides of the third channel layer 19. The third source electrode 223 and the third drain electrode 323 may have an n-type or a p-type conductivity.

Gate insulating films 423 and 433 of the third transistor Tr333 include a lower gate insulating film 423 formed under the third channel layer 19 and an upper gate insulating film 433 formed on the third channel layer 19. The lower gate insulating film 423 and the upper gate insulating film 433 may be the same as the third gate insulating film 403 of FIG. 1. For example, the lower gate insulating film 423 and the upper gate insulating film 433 may include a ferroelectric material. The ferroelectric material of the lower gate insulating film 423 may be different from the ferroelectric material of the upper gate insulating film 433. Furthermore, the lower gate insulating film 423 may include a first polarization state, and the upper gate insulating film 433 may include a second polarization state different from the first polarization state.

The lower gate electrode 523 is provided on a lower part of the lower gate insulating film 423. And the upper gate electrode 533 is provided on the upper gate insulating film 433.

As described with reference to FIG. 1, a threshold voltage of the lower gate electrode 523 in contact with the lower gate insulating film 423 may be changed by the lower gate insulating film 423 having a first polarization state. Also, as described with reference to FIG. 1, a threshold voltage of the upper gate electrode 533 in contact with the upper gate insulating film 433 may be changed by the upper gate insulating film 433 having a second polarization state.

The material of the third channel layer 19 may be the same as the material of the third channel layer 13 of FIG. 1. For example, the third channel layer 19 may include an oxide semiconductor material.

The lower gate electrode 523 may be electrically connected to a portion of the contact electrode 820. For example, the lower gate electrode 523 may contact a protrusion of the contact electrode 820. In this way, the lower gate electrode 523 of the third transistor Tr333 may be electrically connected to the first and second transistors Tr111 and Tr222. As described with reference to FIG. 1, the polarization state of the lower gate insulating film 423 may be controlled by controlling operations of the first and second transistors Tr111 and Tr222.

The upper gate electrode 533 may be electrically connected to a portion of the contact electrode 820. In FIG. 6, it is depicted that the upper gate electrode 533 and the contact electrode 820 are disconnected from each other by being separated from each other, but the upper gate electrode 533 and the contact electrode 820 may be electrically connected to each other through another path (not shown). As described with reference to FIG. 1, the polarization state of the upper gate insulating film 433 may be controlled by controlling operations of the first and second transistors Tr111 and Tr222.

Figure 7:
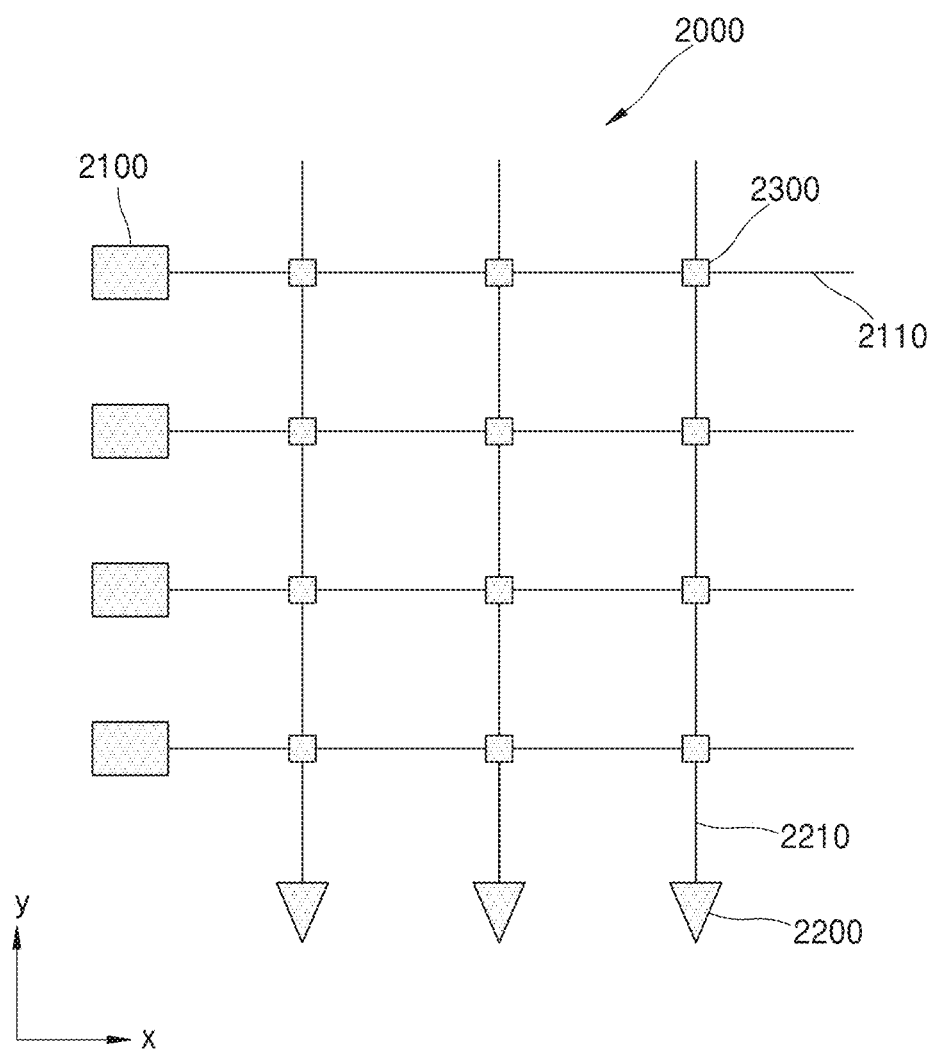
FIG. 7 is a schematic diagram briefly showing a neuromorphic circuit according to an embodiment.

FIG. 7 is a schematic diagram of a neuromorphic circuit 2000 according to an embodiment.

Referring to FIG. 7, the neuromorphic circuit 2000 may include pre-synaptic neuron circuits 2100, pre-synaptic lines 2110 extending in a first direction (for example, an x-axis direction) from the pre-synaptic neuron circuits 2100, post synaptic neuron circuits 2200, post synaptic lines 2210 extending in a second direction (for example, a y-axis direction) from the post synaptic neuron circuits 2200, and synaptic circuits 2300 provided at intersections of the pre-synaptic lines 2110 and the post synaptic lines 2210.

The pre-synaptic neuron circuits 2100 may include a first pre-synaptic neuron and a second pre-synaptic neuron, and the pre-synaptic lines 2110 may include a first pre-synaptic line extending in the first direction from the first pre-synaptic neuron and a second pre-synaptic line extending in the first direction from the second pre-synaptic neuron. Also, the post synaptic neuron circuits 2200 may include a first post synaptic neuron and a second post synaptic neuron circuits, and post synaptic lines 2210 may include a first post synaptic line extending in a second direction from the first post synaptic neuron and a second post synaptic line extending in the second direction from the second post synaptic neuron.

The pre-synaptic neuron circuits 2100 may transmit a signal input from the outside to the synaptic circuits 2300 in the form of an electrical signal through the pre-synaptic lines 2110. Also, the post synaptic neuron circuits 2200 may receive an electrical signal from the synaptic circuits 2300 through the post synaptic lines 2210. Furthermore, the post synaptic neuron circuits 2200 may transmit an electrical signal to the synaptic circuits 2300 through the post synaptic lines 2210.

The synaptic circuits 2300 may include a semiconductor device described with reference to FIGS. 1 through 6.

The neuromorphic circuit 2000 described with reference to FIG. 7 is formed by simulating neuron circuits and synapses structures, which are essential elements of a human brain. When a DNN is implemented by using the neuromorphic circuit 2000, the speed of data processing may be improved and power consumption may be reduced compared to the case when the von Neumann structure of the related art is used.

Figure 8:
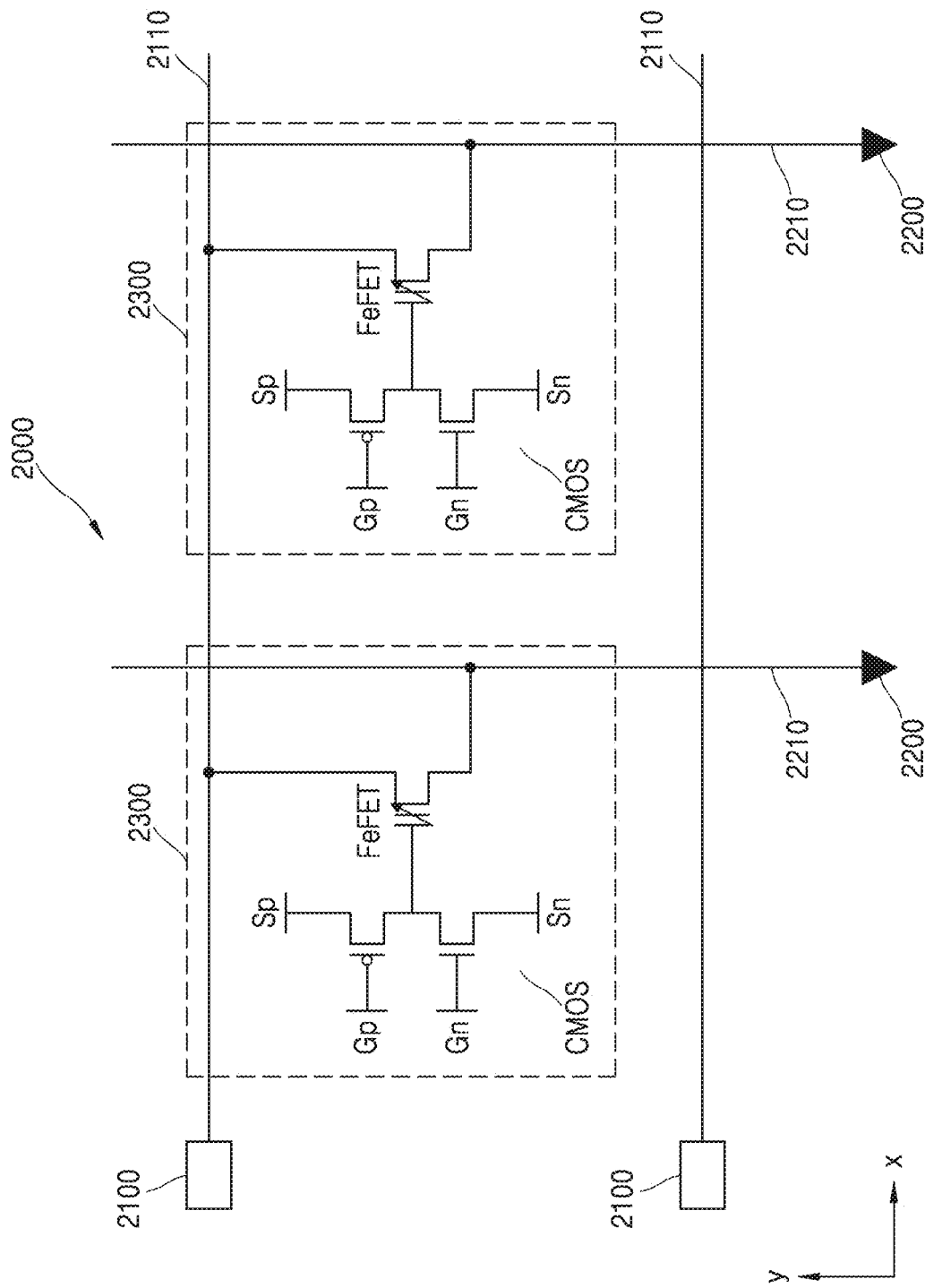
FIG. 8 shows a brief connection structure of a pre-synaptic neuron circuit and a post-synaptic neuron circuit of a synaptic circuit included in the neuromorphic circuit of FIG. 7.

FIG. 8 shows a brief connection structure of a pre-synaptic neuron circuit 2100 and a post-synaptic neuron circuit 2200 of a synaptic circuit 2300 included in the neuromorphic circuit 2000 of FIG. 7.

Referring to FIG. 8, the synaptic circuit 2300 may include one of the semiconductor device described with reference to FIGS. 1 to 6. For example, the synaptic circuit 2300 may include a structure in which a ferroelectric transistor (FeFET) is stacked on a complementary metal oxide semiconductor (CMOS) device. A p-type voltage Gp may be applied to a gate electrode of a p-type element included in the CMOS device, and an n-type voltage Gn may be applied to a gate electrode of an n-type element. The p-type voltage Gp and the n-type voltage Gn may be the same or may be independently controlled. Also, a first operating voltage Sp may be applied to a source electrode of the p-type element of the CMOS device, and a second operating voltage Sn may be applied to a source electrode of the n-type element. In this case, one of the first operating voltage Sp and the second operating voltage Sn may be a ground voltage GND.

The synaptic circuit 2300 may be provided at a crossing point of the pre-synaptic lines 2110 and the post-synaptic lines 2210. For example, a first electrode of the FeFET included in the synaptic circuit 2300 may be electrically connected to a pre-synaptic line 2110 extending in the first direction (an x-axis direction) from the pre-synaptic neuron circuit 2100. Also, a second electrode of the FeFET included in the synaptic circuit 2300 is electrically connected to the post-synaptic line 2210 extending in the second direction (a y-axis direction) from the post-synaptic neuron circuit 2200. The first direction (the x-axis direction) and the second direction (the y-axis direction) may be directions crossing each other. The first electrode and the second electrode of the FeFET may correspond to a drain electrode and a source electrode, respectively.

Figure 9:
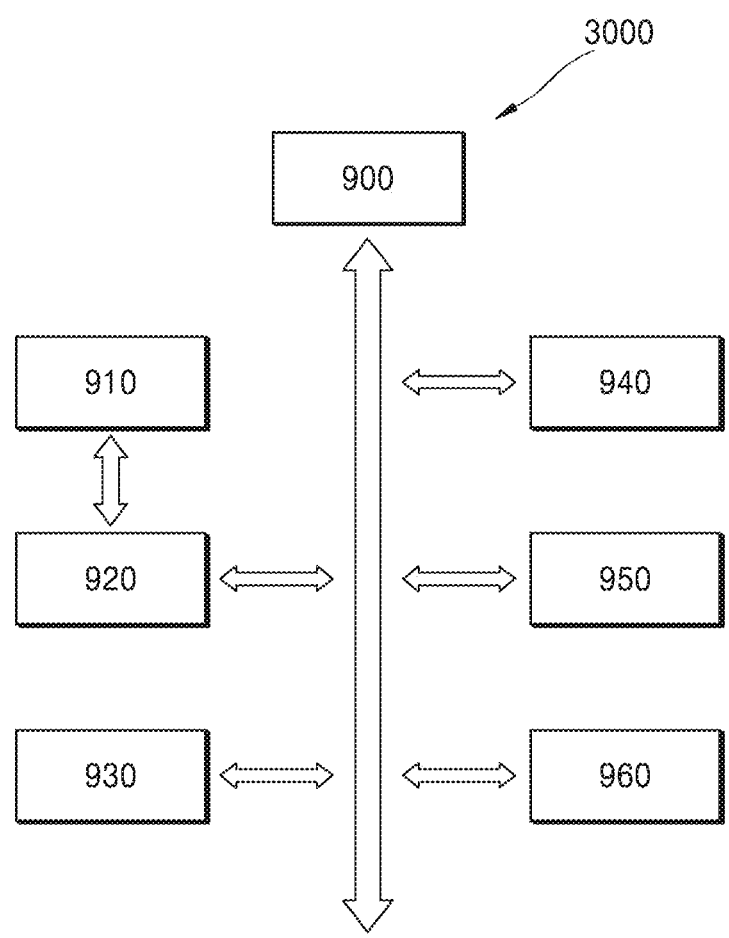
FIG. 9 is a schematic diagram briefly showing a neuromorphic computing apparatus according to an embodiment.

FIG. 9 is a diagram briefly showing a neuromorphic computing apparatus 3000 according to an embodiment.

The neuromorphic computing apparatus 3000 may denote an asynchronous system capable of performing parallel operations by mimicking neurobiological structures, such as a human brain. In the von Neumann architecture of the related art, computing apparatuses perform operations and memory read/write operations are sequentially performed, and thus, there is a limit in increasing a data processing speed.

The neuromorphic computing apparatus 3000 may extract valid information by analyzing input data in real time based on a neural network, and, may determine situation based on the extracted information or may control configurations of an electronic device on which the neuromorphic computing apparatus 3000 is mounted. For example, the neuromorphic computing apparatus 3000 may be applied to a robotic device, such as a drone and an advanced driver assistance system (ADAS), a smart TV, a smart phone, a medical device, a mobile device, an image display device, a measurement device, an IoT device, etc., and besides above, the neuromorphic computing apparatus 3000 may be mounted on at least one of various types of electronic devices.

Hereinafter, a structure of the neuromorphic computing apparatus 3000 having an improved performance compared to the von Neumann computing apparatus will be described with reference to FIG. 9.

Referring to FIG. 9, the neuromorphic computing apparatus 3000 may include an input device 910 for receiving a data signal from the outside, and a neuromorphic circuit 930 that stores and outputs specific information by using a signal received from the input device 910, and a processor 900 that processes information output from the neuromorphic circuit 930. Also, the neuromorphic computing apparatus 3000 may further include an analog-digital converter 920, a memory device 940, a communication device 950, and an output device 960.

The processor 900 may control an overall operation of the neuromorphic computing apparatus 3000. The processor 900 may include one processor core (Single Core) or may include a plurality of processor cores (Multi-Core). The processor 900 may process or execute programs and/or data stored in the memory device 940. In some embodiments, the processor 900 may control functions of the neuromorphic circuit 930 by executing programs stored in the memory device 940. The processor 900 may be implemented as a CPU, a graphics processing unit (GPU), an AP, etc.

The memory device 940 may store various programs that may be executed by the processor 900. For example, the memory device 940 may include a volatile memory, such as DRAM or SRAM. Alternatively, the memory device 940 may include a nonvolatile memory, such as PRAM, MRAM, ReRAM, or NAND flash memory. Furthermore, the memory device 940 may include a hard disk drive (HDD), a solid state drive (SDD), or the like.

The input device 910 may include a microphone, a camera, a scanner, a touch pad, a keyboard, a mouse, or various sensors. The various sensors may collect information around the electronic device on which the neuromorphic computing apparatus 3000 is mounted. The various sensors may sense or receive a signal (for example, an image signal, an audio signal, a magnetic signal, a bio signal, a touch signal, etc.) from the outside of the electronic device, and convert the sensed or received signal into data. For this purpose, the various sensors may include at least one of various types of sensing devices, such as a microphone, an imaging device, an image sensor, a light detection and ranging (LIDAR) sensor, an ultrasonic sensor, an infrared sensor, a bio sensor, and a touch sensor. Through the input device 910, various types of data, such as voice data and image data may be input to the neuromorphic computing apparatus 3000.

The analog-digital converter 920 may include a circuit configured to convert an analog signal from the input device 910 into a digital signal.

The neuromorphic circuit 930 may include the neuromorphic circuit 2000 described with reference to FIG. 7. The neuromorphic circuit 930 may realize a DNN by using data from the analog-digital converter 920.

The communication device 950 may include various wired or wireless interfaces that may communicate with external devices. For example, the communication device 950 may include a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), Power Line communication (PLC), or a communication interface that may be connected to a mobile cellular network, such as 3G (3rd Generation), 4G (4th Generation), 5G (5th Generation), or Long Term Evolution (LTE).

The output device 960 may output a signal in various forms. For example, the output device 960 may include a speaker, a printer, a monitor, a display panel, a beam projector, a hologram, etc.

The embodiments according to the present disclosure may provide a semiconductor device having improved uniformity and symmetry of a resistance change pattern.

The embodiments according to the present disclosure may provide a neuromorphic circuit and a neuromorphic computing apparatus including a semiconductor device having an excellent characteristic. In some embodiments, the neuromorphic circuit and/or neuromorphic computing apparatus in FIGS. 6 and 7 may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

Specific executions described in the present disclosure are example embodiments and do not limit the technical scope of inventive concepts. For conciseness of the specification, disclosure of conventional electronic configurations, control systems, software, and other functional aspects of the systems may be omitted. Also, connections or connection members of lines between components shown in the drawings illustrate functional connections and/or physical or circuit connections, and the connections or connection members can be represented by replaceable or additional various functional connections, physical connections, or circuit connections in an actual apparatus. Also, it should be understood that inventive concepts not limited to the embodiments described above. This is because various changes in form and details may be made by those of ordinary skill in the art.

What is claimed is:

1. A neuromorphic circuit comprising:
pre-synaptic neuron circuits;
pre-synaptic lines extending in a first direction from the pre-synaptic neuron circuits;
post synaptic neuron circuits;
post synaptic lines extending from the post synaptic neuron circuits in a second direction crossing the first direction; and
synaptic circuits provided at intersections of the pre-synaptic lines and the post synaptic lines,
the synaptic circuits each including a first transistor including a first channel layer of a first conductivity type, a second transistor having a second channel layer of a second conductivity type, and a third transistor being positioned on at least one of the first transistor and the second transistor on a substrate,
wherein the third transistor includes a third channel layer and a gate electrode that are spaced apart from each other in a thickness direction with a gate insulating film therebetween, the third channel layer including at least one of InGaZnO, InZnO, and InSnZnO, and the gate insulating film including a ferroelectric material comprising at least one of HfO, $Hf_xZr_{1-x}O$, and ZrO.

2. The neuromorphic circuit of claim 1, wherein the first transistor and the second transistor are electrically connected to each other.

3. The neuromorphic circuit of claim 1, further comprising:
a contact electrode, wherein
the contact electrode electrically connects a drain electrode of the first transistor to a drain electrode of the second transistor.

4. The neuromorphic circuit of claim 3, wherein a portion of the contact electrode is in contact with the gate electrode of the third transistor.

5. The neuromorphic circuit of claim 1, wherein a variation of a resistance of the third channel layer according to a signal applied to the gate electrode of the third transistor has symmetry.

6. The neuromorphic circuit of claim 1, wherein a resistance of the third channel layer according to a signal applied to the gate electrode of the third transistor linearly changes.

7. The neuromorphic circuit of claim 1, wherein
the ferroelectric material is doped with at least one of Si, Al, Zr, Y, La, Gd, Sr, and Hf.

8. The neuromorphic circuit of claim 1, wherein
the gate electrode of the third transistor is above the gate insulating film, and
the third channel layer is below the gate insulating film.

9. The neuromorphic circuit of claim 1, wherein
the gate insulating film is a lower gate insulating film that is below the third channel layer,
the third transistor further includes an upper gate insulating film above the third channel layer that includes a ferroelectric material, and
the gate electrode is a lower gate electrode below the lower gate insulating film, and
the third transistor further includes an upper gate electrode above the upper gate insulating film.

10. The neuromorphic circuit of claim 9, wherein the lower gate insulating film includes a first polarization state and the upper gate insulating film includes a second polarization state that is different from the first polarization state.

11. The neuromorphic circuit of claim 1, wherein the first channel layer and the second channel layer each include silicon.

12. A neuromorphic computing apparatus comprising:
an input device;
the neuromorphic circuit of claim 1, the neuromorphic circuit being configured to store and output specific information using a signal received from the input device; and
a processor configured to process information that is output from the neuromorphic circuit.

13. A neuromorphic circuit comprising:
a synaptic circuit including a semiconductor device;
a pre-synaptic neuron circuit;
a pre-synaptic line connecting the synaptic circuit to the pre-synaptic neuron circuit;
a post-synaptic neuron circuit; and
a post-synaptic line connecting the synaptic circuit to the post-synaptic neuron circuit, wherein
the semiconductor device includes a CMOS circuit including a first transistor of a first conductivity type and a second transistor of a second conductivity type, a third transistor, and a contact electrode,
the third transistor includes a gate electrode, a channel, and a gate insulating film,
the gate insulating film includes a ferroelectric material,
the contact electrode is connected to the gate electrode of the third transistor, a drain of the first transistor, and a drain of the second transistor,
the channel of the third transistor is laterally between a source electrode of the third transistor and a drain electrode of the third transistor such that the channel of the third transistor contacts a sidewall of the source electrode of the third transistor and a sidewall of the drain electrode of the third transistor,
the gate electrode is spaced apart vertically from the channel, does not vertically overlap the source electrode of the third transistor, and does not vertically overlap the drain electrode of the third transistor,
the ferroelectric material includes at least one of HfO, $Hf_xZr_{1-x}O$, and ZrO,
the ferroelectric material is doped with at least one of Si, Al, Zr, Y, La, Gd, Sr, and Hf, and
the channel of the third transistor includes at least one of InGaZnO, InZnO, and InSnZnO.

14. The neuromorphic circuit of claim 13, wherein the first transistor and the second transistor are electrically connected to each other.

15. The neuromorphic circuit of claim 13, wherein a portion of the contact electrode is in contact with the gate electrode of the third transistor.

16. The neuromorphic circuit of claim 13, wherein a variation of a resistance of the channel of the third transistor according to a signal applied to the gate electrode of the third transistor has symmetry.

17. The neuromorphic circuit of claim 13, wherein a resistance of the channel of the third transistor according to a signal applied to the gate electrode of the third transistor linearly changes.

18. The neuromorphic circuit of claim 13, wherein
the gate electrode of the third transistor is above the gate insulating film, and
the channel of the third transistor is below the gate insulating film.

19. The neuromorphic circuit of claim 13, wherein
the first transistor includes a first channel layer,
the second transistor includes a second channel layer, and
the first channel layer and the second channel layer each include silicon.

20. A neuromorphic computing apparatus comprising:
an input device;
the neuromorphic circuit of claim 13, the neuromorphic circuit being configured to store and output specific information using a signal received from the input device; and
a processor configured to process information that is output from the neuromorphic circuit.

* * * * *